US007489023B2

(12) United States Patent
Pape

(10) Patent No.: US 7,489,023 B2
(45) Date of Patent: Feb. 10, 2009

(54) SEMICONDUCTOR DEVICE INCLUDING A SEMICONDUCTOR CHIP WITH SIGNAL CONTACT AREAS AND SUPPLY CONTACT AREAS, AND METHOD FOR PRODUCING THE SEMICONDUCTOR DEVICE

(75) Inventor: Heinz Pape, Aschheim (DE)

(73) Assignee: Infineon Technologies AG, Neubiberg (DE)

( * ) Notice: Subject to any disclaimer, the term of this patent is extended or adjusted under 35 U.S.C. 154(b) by 193 days.

(21) Appl. No.: 11/362,509

(22) Filed: Feb. 27, 2006

(65) Prior Publication Data

US 2006/0197234 A1    Sep. 7, 2006

(30) Foreign Application Priority Data

Feb. 25, 2005    (DE) .................... 10 2005 009 163

(51) Int. Cl.
*H01L 23/495* (2006.01)
(52) U.S. Cl. .............. 257/666; 257/691; 257/E23.043
(58) Field of Classification Search ............. 257/691, 257/666, 784, 786, E23.043
See application file for complete search history.

(56) References Cited

U.S. PATENT DOCUMENTS

| 4,801,999 A | 1/1989 | Hayward et al. |
| 4,835,120 A | 5/1989 | Mallik et al. |
| 5,115,298 A | 5/1992 | Loh |
| 5,235,207 A | 8/1993 | Ohi et al. |
| 6,040,626 A | 3/2000 | Cheah et al. |
| 6,093,957 A | 7/2000 | Kwon |
| 6,861,753 B1* | 3/2005 | Chen et al. ............... 257/758 |
| 7,151,309 B2* | 12/2006 | Saran ....................... 257/691 |
| 2001/0052642 A1 | 12/2001 | Wood et al. |
| 2005/0006735 A1* | 1/2005 | an Tatt et al. ............ 257/676 |
| 2005/0173783 A1* | 8/2005 | Chow et al. ............. 257/666 |

FOREIGN PATENT DOCUMENTS

| DE | 196 31 046 A1 | 2/1998 |
| DE | 103 49 477 A1 | 2/2005 |
| JP | 061 812 80 A2 | 6/1994 |

\* cited by examiner

*Primary Examiner*—Phat X Cao
(74) *Attorney, Agent, or Firm*—Edell, Shapiro & Finnan, LLC

(57) ABSTRACT

A semiconductor device includes a semiconductor chip, where the semiconductor chip includes signal contact areas and supply contact areas. The signal contact areas are arranged on edge regions of the active top side of the semiconductor chip and are electrically connected to external signal exterior connections of the semiconductor device by connecting elements. The active top side of the semiconductor chip includes at least two supply collective electrodes made of annularly patterned metal foils which are arranged within the signal contact areas and are affixed in an electrically insulating manner on the top side. The supply collective electrodes are electrically connected to the supply contact areas of the semiconductor chip by internal connecting elements.

10 Claims, 4 Drawing Sheets

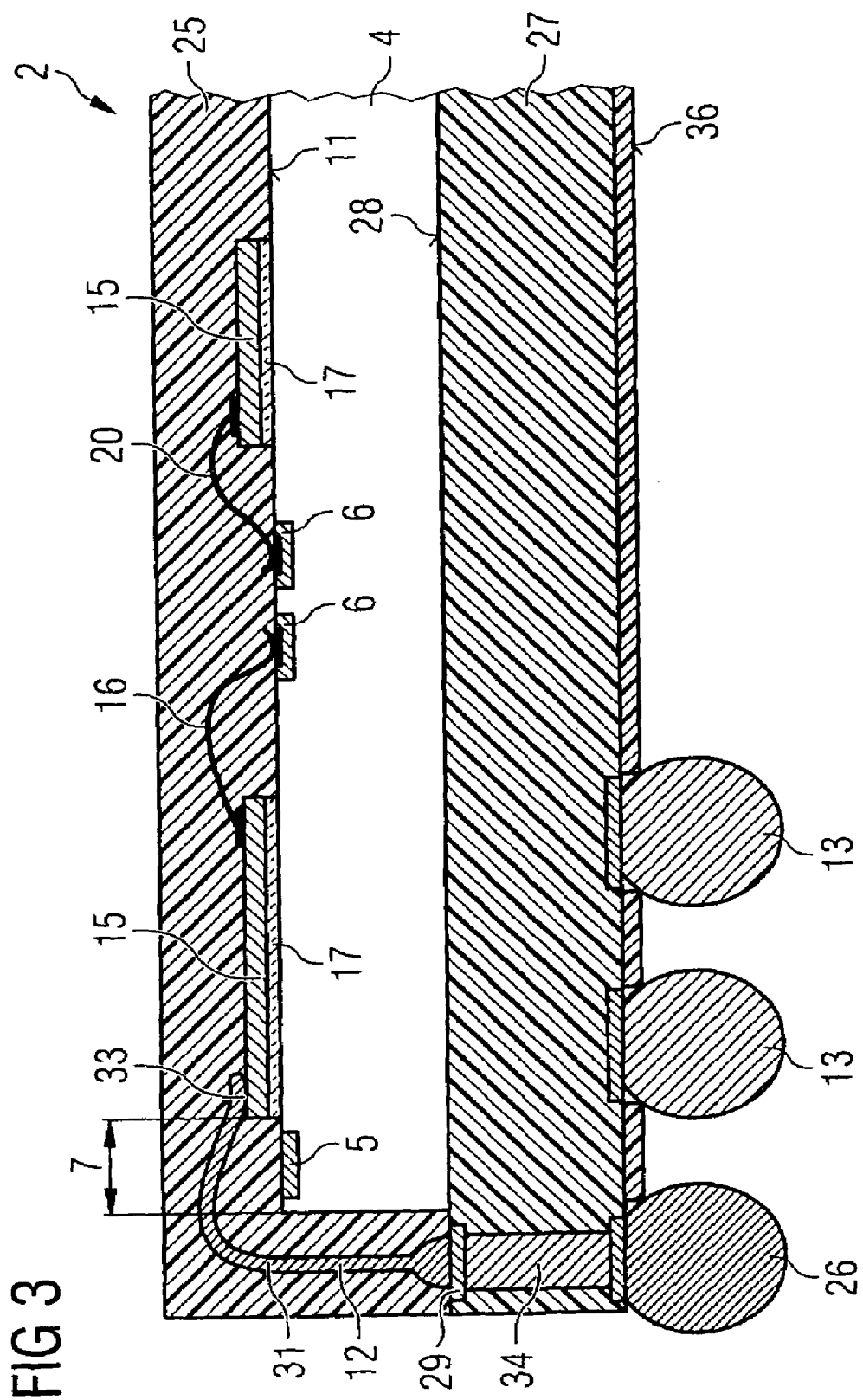

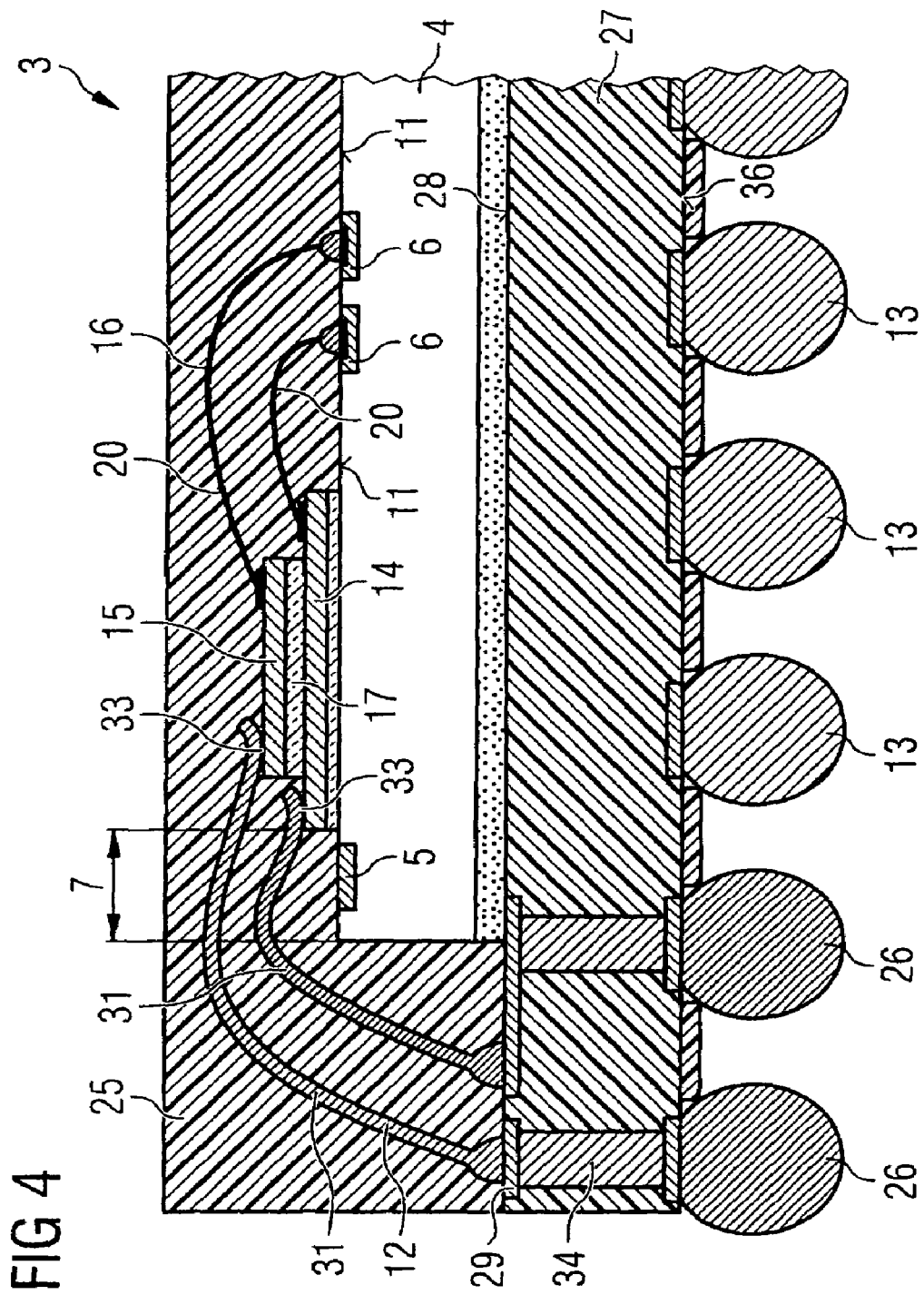

SEMICONDUCTOR DEVICE INCLUDING A SEMICONDUCTOR CHIP WITH SIGNAL CONTACT AREAS AND SUPPLY CONTACT AREAS, AND METHOD FOR PRODUCING THE SEMICONDUCTOR DEVICE

CROSS REFERENCE TO RELATED APPLICATIONS

This application claims priority under 35 USC §119 to German Application No. DE 10 2005 009 163.6, filed on Feb. 25, 2005, and titled "Semiconductor Device Having a Semiconductor Chip, Which Has Signal Contact Areas and Supply Contact Areas, and Method for Producing the Semiconductor Device," the entire contents of which are hereby incorporated by reference.

FIELD OF THE INVENTION

The invention relates to a semiconductor device including a semiconductor chip, which has signal contact areas and supply contact areas, and to a method for producing the semiconductor device.

BACKGROUND

The number of signal contact areas and supply contact areas is constantly increasing for large scale integrated semiconductor devices, while the area requirement per switching function is constantly decreasing. This is realized by advanced miniaturization of the circuit structures on a semiconductor chip with each new technology generation, which is usually characterized by the smallest feature sizes that can be attained, such as e.g. 130 nanometer technology, 90 bnanometer technology, 65 nanometer technology, etc. This large scale integration is furthermore fostered by a vertical integration of an increasing number of wiring planes, such as metal layer M1, metal layer M2, up to metal layer M(x−1) and M(x). However, the power consumption per function cannot be reduced to the same extent as the area requirement per function, so that the power densities of semiconductor ICs tend to increase.

In order to reduce the internal electric field strength, for example to enable the insulation distances to be halved, the supply voltages are constantly being reduced from, e.g., a 12 V technology through a 5 V technology, a 3.3 V technology, a 2.5 V technology to 1.8 V technology, etc. However, the reduction of the supply voltage, in conjunction with a simultaneously increasing power consumption, leads to ever higher currents. It thus turns out that in the case of communication ICs having a power consumption of P=3-4 W, depending on the supply voltage U, it is necessary to cope with currents I of 1 A to 2 A. These currents are intended to be distributed on the semiconductor chip to the switching function through metal cross-sections having the lowest possible resistance, in order to avoid local voltage dips. Wide low-resistance metal tracks on the semiconductor chip cost valuable semiconductor chip surface area, however, and entail potential reliability problems.

At the same time, as the integration density increases, the metal cross-sections decrease between the outer contact areas on the top side of a semiconductor chip and the topmost metallization plane of the integrated circuit and so their current-carrying capacity also decreases correspondingly. In the case of modern technologies, a current of 10 mA per contact area can typically be fed in at the present time. In order to feed a total current of I=1 A into the circuit, accordingly, 100 supply contact areas are required on the top side of the semiconductor chip for the introduction of the current of 1 A and, in addition, just as many ground contact areas are required in order to enable the current to flow away again.

In the case of semiconductor products having 200 to 1,000 connections which are being constructed as BGA devices (ball grid array devices) in the meantime, a very high proportion of the connections is thus required only as supply connections, so that, depending on the power consumption, up to half or more of these exterior contact connections have to be included in the design for supplying current to the supply contact areas on the top side of the semiconductor chip. In the interior of the semiconductor device, the wire bonding technique is often used, which involves having to produce in some instances long bonding wires lying close together, in which case production problems and production risks such as wire drifting or short circuits may occur. Consequently, the limit in terms of being able to realize such large scale integrated circuits is gradually being reached.

Moreover, at increasingly higher signal frequencies there is the risk of long and closely adjacent bonding wires increasing the inductance and/or the crosstalk, which can likewise impede product realization. The high number of supply connections that are to be contact-connected externally from a semiconductor chip thus becomes a problem from the standpoint of feasibility, performance and also production costs, particularly in the case of wire bonding contact-connections. In the case of the wire bonding contact-connection, the above-described densest possible contact-connection of supply contact areas and signal contact areas which are arranged at the semiconductor chip periphery and have to be led onto an organic or ceramic substrate is associated with the disadvantages and risks described above.

In the case of the flip-chip mounting technique, the production of many supply contact connections can be simplified, but expensive multilayer substrates with different metallization planes and plated-through holes are then required, and, in the case of the customary semiconductor chip patternings, a rewiring layer is required directly on the chip in order to reach the individual integrated circuit structures from the periphery signal contact areas and supply contact areas. In this case, such a rewiring layer on the semiconductor chip is to be adapted to the respective chip design in a disadvantageous manner, while greater flexibility is possible in the case of the wire bonding technique.

For power semiconductor devices, the problem of the supply connections is solved by means of metallic plate-type collective electrodes on the top side of the semiconductor device, as is disclosed in the U.S. Pat. No. 6,040,626. The patent application DE 103 49 477 also proposes, for a power MOSFET device, a collective electrode for all the source connections on the top side of the semiconductor chip, said electrode being arranged in plate-type fashion and being connected to corresponding exterior flat conductors of a flat conductor leadframe.

SUMMARY OF THE INVENTION

The present invention solves the problem, for large scale integrated semiconductor devices, of the increasing power consumption and to overcome the abovementioned disadvantages in the prior art. The present invention reduces the number of supply connections externally toward a substrate or toward a flat conductor leadframe, so that more space is created for signal connections.

In accordance with the invention, a semiconductor device comprises a semiconductor chip that includes signal contact areas and supply contact areas on its active top side. The signal contact areas are arranged on edge regions of the active top side of the semiconductor chip and are connected by connecting elements to external exterior connections of the semiconductor device. The top side of the semiconductor chip includes at least two supply collective electrodes made of annularly patterned metal foils. These annularly patterned metal foils are arranged within the signal contact areas and fixed in an electrically insulated manner on the top side. The annular supply collective electrodes are connected by connecting elements to external supply exterior connections of the semiconductor device.

This semiconductor device provides the advantage that it is possible practically to half the internal signal connecting elements in the edge regions of the active top side of the semiconductor chip since all of the supply contact areas can be connected to a ground potential or to an operating potential by the annular supply collective electrodes arranged on the top side of the semiconductor chip, without requiring long bonding connections from the top side of the semiconductor chip to corresponding contact pads of a wiring substrate or of a flat conductor leadframe. Rather, the connecting elements are now limited exclusively to the active top side of the semiconductor chip.

Consequently, the present invention solves the problem of reduction of area in conjunction with an increasing demand for signal contact areas and supply contact areas by virtue of the fact that within the outer periphery ring, comprising signal contact areas which are contact-connected externally to a flat conductor leadframe or to a wiring substrate, at least one annular supply collective electrode in the form of a metal foil is provided onto the chip surface within the periphery ring comprising signal contact areas. The metal foil may be adhesively bonded or soldered as a metal sheet or on a plastic carrier onto the top side of the chip.

In the simplest and most cost-effective embodiment of the invention, the supply collective electrode is a copper foil including solderable or bondable surface regions which can be coated with gold or silver and are prepared and used in a manner similar to that for flat conductor leadframes. Such an annular electrode can be embodied significantly more solidly and with lower resistance than a metal layer or a rewiring on the semiconductor chip and thus provides a stabler supply potential. These supply collective electrodes may in part also replace supply lines of the upper metal layer and form a part of the semiconductor chip design and thus help to save semiconductor chip area.

With two of these supply collective electrodes, most of the supply contact areas both for the ground connection and for the power connection are connected by bonding or soldering contact connections in the direction of the annular supply collective electrodes. Only a few bonding or soldering connections which extend beyond the smart card to the flat frame or the wiring substrate are required for application of the associated supply potential. The annular supply collective electrodes function as potential busbars or current distributors on the active top side of the semiconductor chip. This provides the advantage that the number of connections toward the outside is significantly reduced and, moreover, bonding wires can be made shorter and adjacent bonding wires can extend in different directions both inwardly and outwardly from the annular supply collective electrode, so that the individual bonding arcs are at a greater distance from one another, which reduces interfering inductances and interfering crosstalk.

In one preferred embodiment of the invention, the supply collective electrodes are arranged in a manner stacked one above another on the top side of the semiconductor chip, an insulation layer being arranged between the supply collective electrodes. In such an embodiment of the invention, the stacking of the supply collective electrodes obtains additionally available area on the top side of the semiconductor chips which is available for supply contact areas and/or for additional signal contact areas on the top side of the semiconductor chip. In principle, it thus becomes possible to double the number of signal contact areas on the top side of the semiconductor chip without additional measures being required.

In a further preferred embodiment of the invention, at least one of the supply collective electrodes is provided for a ground potential and another supply collective electrode has a supply potential. Consequently, these annular supply collective electrodes can supply all of the supply contact areas, whether for application of a ground potential or for application of a power potential. If a plurality of potentials are required for the functionality of an integrated circuit, then it is also possible for more than two annular supply collective electrodes to be arranged either in a manner stacked one on top of another or in a manner staggered one in another on the active top side of the semiconductor chip. In this latter case, the supply collective electrodes are arranged adjacent to one another and patterned such that they lie annularly one in another.

In a further preferred embodiment of the invention, discrete components are arranged between the supply collective electrodes. Voltage protection diodes and/or discrete capacitors and/or induction components may preferably be accommodated there, for which purpose the distance between the two annular supply collective electrodes lying one in another can be greater and adapted to the electrode spacing of the respective discrete bonding elements. Preferably, surface-mountable discrete components are arranged between the spaced-apart supply collective electrodes.

Furthermore it is provided that the supply contact areas of the semiconductor chip are internally electrically connected to the supply collective electrodes by bonding wire connections on the active top side of the semiconductor chip. Such bonding wire connections can be provided relatively inexpensively by the customary bonding wire techniques on a surface of a semiconductor chip, one end of the bonding wire being fixed on the supply collective electrode and the other end of the bonding wire line being connected to a supply contact area. Such bonding wire connections on the active top side can be produced relatively cost-effectively by corresponding standard technologies. In this case, the directions in which the bonding wires are to be laid are relatively freely selectable and depend only on the position of the supply contact area.

In a further preferred embodiment of the invention, the supply contact areas of the semiconductor chip are electrically connected to the supply collective electrodes by conductor tracks on the top side of the semiconductor chip. This variant of the wiring manages without bonding wires and has the advantage that such conductor tracks can already be prepared for very many semiconductor chips on a semiconductor wafer and afterward it is then possible to solder the supply collective electrodes as annular metal structures or to adhesively bond them by conductive adhesive onto said conductor tracks at the locations provided. By virtue of the adhesive bonding by conductive adhesive or by virtue of the soldering onto the conductor tracks to the supply contact areas, a multiplicity of supply contact areas can be connected to the supply collective electrodes in one work operation, which reduces the production costs.

In a further embodiment of the invention, the supply collective electrodes have so-called bonding lugs which, with the production of the supply collective electrodes, are fashioned from a metal foil material, for example by stamping out or etching, and extend from the supply collective electrodes to the supply contact areas. In order to produce a connection between the bonding lugs and the supply contact areas, the free ends of the bonding lugs are bonded onto the supply contact areas. The bonding lugs are preferably directed inward and the corresponding supply contact areas are arranged within the annular supply collective electrodes or between the annular supply collective electrodes.

In a further preferred embodiment of the invention, the semiconductor chip includes an outer annular supply collective electrode and an inner annular supply collective electrode, the outer annular supply collective electrode including an open ring with at least one passage opening in which is arranged a strip-type lead to the inner supply collective electrode. What is achieved by this arrangement is that the inner supply collective electrode does not have to be connected to corresponding exterior contacts of the semiconductor chip by corresponding bonding wires, but rather is firstly led via a strip-type lead to the edge of the semiconductor chip and only from there is connected to a supply contact area by a relatively short bonding connection to a wiring substrate or to a flat frame. If appropriate, the periphery ring comprising supply electrodes may be equipped with indentations or interruptions for reducing thermomechanical stresses or with gaps for transmitting other potentials. If necessary, corresponding fingers or lugs or lines may also proceed from the ring segments of the supply collective electrodes and supply e.g. supply contact areas in the interior region of the semiconductor chip.

Since the supply collective electrodes on the top side of the semiconductor chip are not part of an outer flat conductor leadframe, they can be arranged in the respective semiconductor chip positions of a semiconductor wafer as early as at the wafer level in terms of production engineering. Consequently, processes, materials and techniques for connection and contact-connection are also available which cannot be used when mounting a semiconductor chip into a housing in the context of so-called "back end production", but rather are already customary in "front end techniques", such as, for example, sintering techniques and soldering techniques at a high temperature on semiconductor wafers.

As already explained above, the supply collective electrodes, by an insulator layer in the form of a dielectric, may also be arranged one above another in part and thus form a capacitor. Such embodiments are possible without problems on glass or ceramic carriers using thick film technology. On the other hand, such stacked supply collective electrodes can also be realized by metal foils that are adhesively bonded one above another, at least one metal foil of which projects laterally in order to ensure a corresponding possibility of connection to the lower one of the two supply collective electrodes. Furthermore, the supply collective electrodes may be provided, already prefabricated, with additional discrete and passive components between the two supply collective electrodes for the voltage supply and for the ground potential and also be connected to one another by said passive components.

As already mentioned above, capacitors are preferably provided to safeguard against voltage dips and/or as short-term emergency current supply in the event of power interruptions. Diodes may be arranged between the supply collective electrodes for the purpose of overvoltage protection. These discrete components may also already be applied on the wafer using a surface mounting technique, thereby avoiding possibly undesirable soldering operations during the mounting of the individual housing of a semiconductor device.

In comparison with the prior art, in which plate-type structures are chosen as supply collective electrodes for power components, the invention utilizes metal rings made of a metal foil or a metal foil on a carrier that are adhesively bonded or soldered on in the inner region of the top side of the semiconductor chip, to which metal rings most of the supply contact areas are connected by contact-connection within the annular supply collective electrodes and to which metal rings, consequently, the supply potential can be applied only by a few outer contacts of the semiconductor device. The number and the density of the required connections toward the outside, that is to say to exterior contacts of the semiconductor device, are thus drastically reduced, with the result that it becomes possible also to reduce the number of exterior contacts to approximately half of the previous exterior contacts.

A method for producing a semiconductor device including a semiconductor chip which has signal contact areas and supply contact areas, can be realized with the following method steps.

The first step involves producing a semiconductor chip including signal contact areas and supply contact areas on its active top side, at least the signal contact areas being arranged on edge regions of the active top side of the semiconductor chip. For a semiconductor chip of this type, a metal foil is patterned to form annular supply collective electrodes. These annular supply collective electrodes are fixed on the semiconductor chip within the signal contact areas in such a way that the signal contact areas surround said supply collective electrodes on the outer side.

Afterward, the annular supply collective electrodes are connected by internal connecting elements to the supply contact areas on the top side of the semiconductor chip. Finally, the supply collective electrodes and the signal contact areas can then be connected by connecting elements to external exterior connections of the semiconductor device. After these connections have been realized, the semiconductor chip and the connecting elements can be connected in a housing to form a semiconductor device.

This semiconductor device has the advantage that, despite an increasing power density with a high integration level, it is possible to ensure a low-resistance supply of the functional elements with correspondingly high currents without a fall in the supply potential. Furthermore, the method has the advantage that the method steps can be carried out on a semiconductor wafer for a plurality of semiconductor devices, so that this method leads to inexpensive semiconductor devices. It is thus possible, e.g., to pattern the metal foil for the supply collective electrodes in such a way that it can be soldered or adhesively bonded directly onto a semiconductor wafer after the individual integrated circuit elements have been produced on the semiconductor wafer.

Consequently, in one preferred embodiment, application and fixing of the supply collective electrodes on the semiconductor chip within the signal contact areas are carried out simultaneously for a plurality of semiconductor devices on a semiconductor wafer by a correspondingly patterned metal foil that is adhesive on one side being adhesively bonded onto the semiconductor wafer.

In a further embodiment for carrying out the method of the invention, the supply collective electrodes are arranged adjacent to one another and are applied to the top side of the semiconductor chips in a manner such that they lie annularly one in another. As an alternative, the supply collective electrodes may also be arranged in a manner stacked one above another on the top side, an insulation layer being arranged between the supply collective electrodes. Furthermore, it is possible to use the known methods for the patterning and metallization of semiconductor wafers in order that, simultaneously for a large number of semiconductor devices, the supply contact areas of the semiconductor chips together with the supply collective electrodes are electrically connected to one another simultaneously for a plurality of semiconductor chips on a semiconductor wafer by internal conductor tracks on the top side of the semiconductor wafer.

It is also possible to arrange bonding wire connections from the supply contact areas to the supply collective electrodes internally on the top side of the semiconductor chip, which thus have a shortened bonding wire length and are consequently suitable for high-frequency applications since crosstalk is eliminated and inductive couplings are likewise avoided.

A further embodiment of the method of the invention provides for the supply contact areas of the semiconductor chip together with the supply collective electrodes to be internally electrically connected to one another by bonding lugs produced during the patterning of the metal foil. For the operation of the semiconductor chip, a ground potential and supply potentials are applied to a small number of exterior connections of the semiconductor device for the supply collective electrodes.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 3 schematically depicts a cross-section through a portion of the semiconductor device of FIG. 2.

FIG. 4 schematically depicts a cross-section through a portion of a semiconductor device of a third embodiment of the invention.

DETAILED DESCRIPTION

Figure 1:
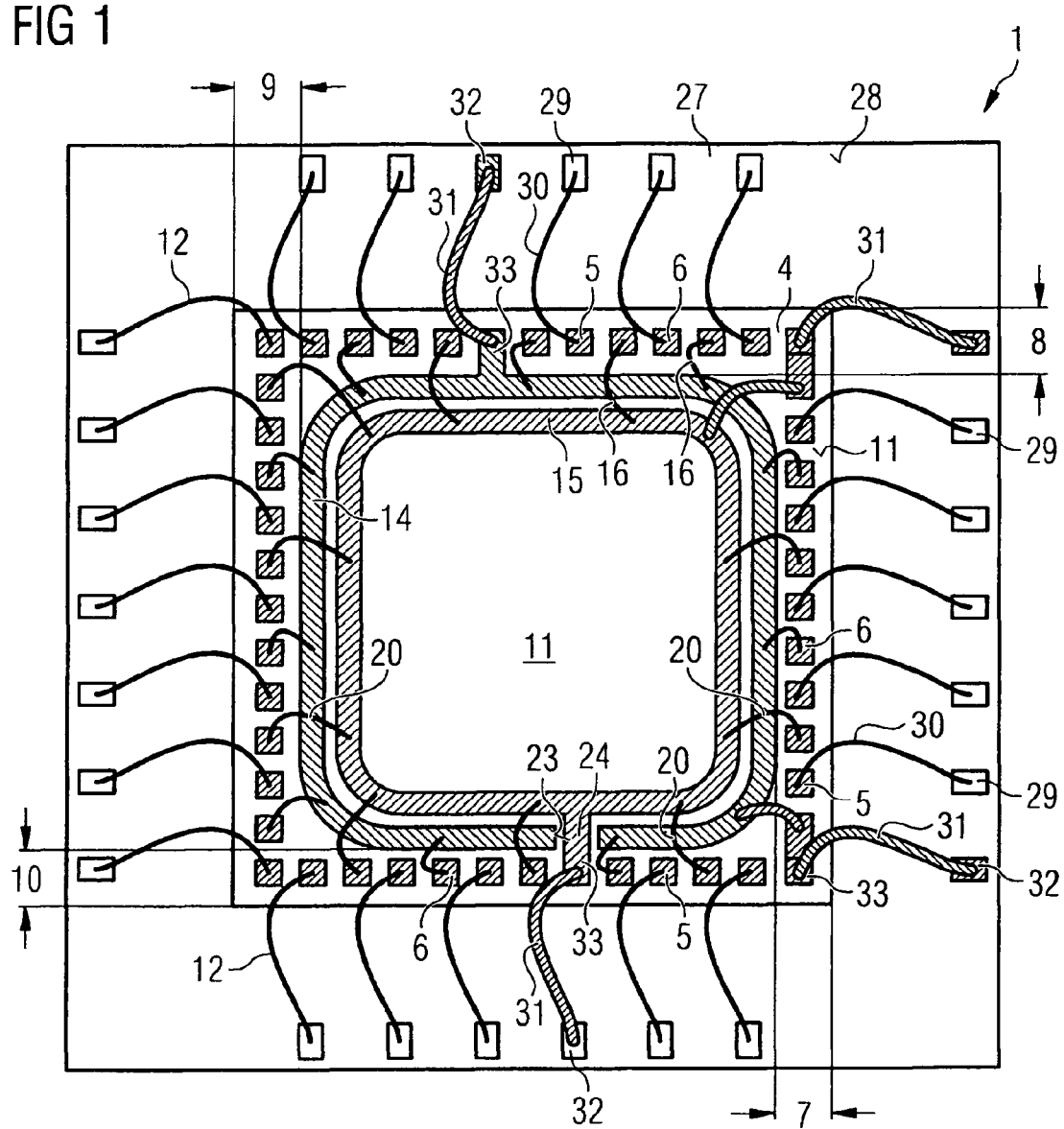
FIG. 1 schematically depicts a plan view of a semiconductor device of a first embodiment of the invention.

FIG. 1 schematically shows a plan view of a semiconductor device 1 of a first embodiment of the invention. This semiconductor device 1 includes a wiring substrate 27 with a top side 28, the areal extent of which is greater than the areal extent of a semiconductor chip 4. FIG. 1 depicts the active top side 11 of the semiconductor chip 4, in which case a plastic housing composition in which the semiconductor chip 4 and the wiring substrate 27 are embodied has been omitted in order to better illustrate the invention.

Signal contact areas 5 and supply contact areas 6 are arranged alternately in the edge regions 7, 8, 9 and 10 of the top side 11 of the semiconductor chip 4. In conventional semiconductor devices, signal contact areas 5 and supply contact areas 6 arranged in the edge regions 7, 8, 9 and 10 are electrically connected to corresponding contact pads 29 on the top side 28 of the wiring substrate 27 by connecting elements 12.

In this embodiment of the invention, connecting elements 12 are bonding wires 30 and 31, but the number thereof does not correspond to the number of signal contact areas 5 and supply contact areas 6 on the edge regions 7, 8, 9 and 10. Rather, only signal contact areas 5 on the top side 11 of the semiconductor chip 4 are electrically connected with the bonding wires 30. The bonding wires 30 may be constructed from thin gold wires having a thickness from 15 μm to 50 μm, since only electrical signals can be passed from and to the semiconductor chip 4 via said bonding wires 30.

Instead of a multiplicity of similarly thin bonding wires 30 between contact pads 29 on the top side 28 of the wiring substrate 27 and the supply contact areas 6 on the active top side 11 of the semiconductor chip 4, only four thick bonding wires 31 are led to the wiring substrate 27. These thick bonding wires 31 are made of aluminum and have a diameter from 50 μm and 600 μm. These thick bonding wires 31 form connecting elements 12 between corresponding supply contact pads 32 of the wiring substrate 27 and supply contact pads 33 in edge regions 7, 8, 9 and 10 of the semiconductor chip 4.

Supply contact pads 33 are embodied more solidly or with a larger area than the rest of the supply contact areas 6 on the top side 11 of the semiconductor chip 4. These more solid supply contact pads 33 are connected to annular supply collective electrodes 14 or 15, to which a ground potential and a supply potential can be applied via the bonding wires 31 and the supply contact pads 33. The annular supply collective electrodes 14, 15 on the top side 11 of the semiconductor chip 4 are electrically connected by relatively short bonding wire connections 20 which are arranged in part in edge regions 7, 8, 9 and 10 of the top side 11 of the semiconductor chip 4 in this embodiment of the invention.

Such short bonding wire connections 20 have the advantage of a reduced induction loop and therefore yield reduced crosstalk in the case of high-frequency communication devices. Moreover, with the aid of this construction of the first embodiment of the invention, the number of bonding wire connections 30, 31 routed toward the outside is significantly reduced. Corresponding internal connecting elements 16 made of the shortened bonding wires 20 are situated on the active top side 11 of the semiconductor chip 4. While the inner annular supply collective electrode 15 has a closed ring, the outer supply collective electrode 14 forms an open ring with a passage opening 23, through which a strip-type lead 24 is led to the inner supply collective electrode 15. The strip-type lead 24 then merges into a supply contact area 33 which is connected by a thick bonding wire 31 to an exterior contact (not shown) via the supply contact pad 32.

The plan view of FIG. 1 makes clear the great extent to which it is possible to reduce the number of electrical connections routed outward from the active top side 11 of the semiconductor chip 4 to corresponding exterior contacts of the semiconductor device 1. Further advantages of such a semiconductor device 1 and also advantageous methods for producing such a semiconductor device 1 have already been described above.

Figure 2:
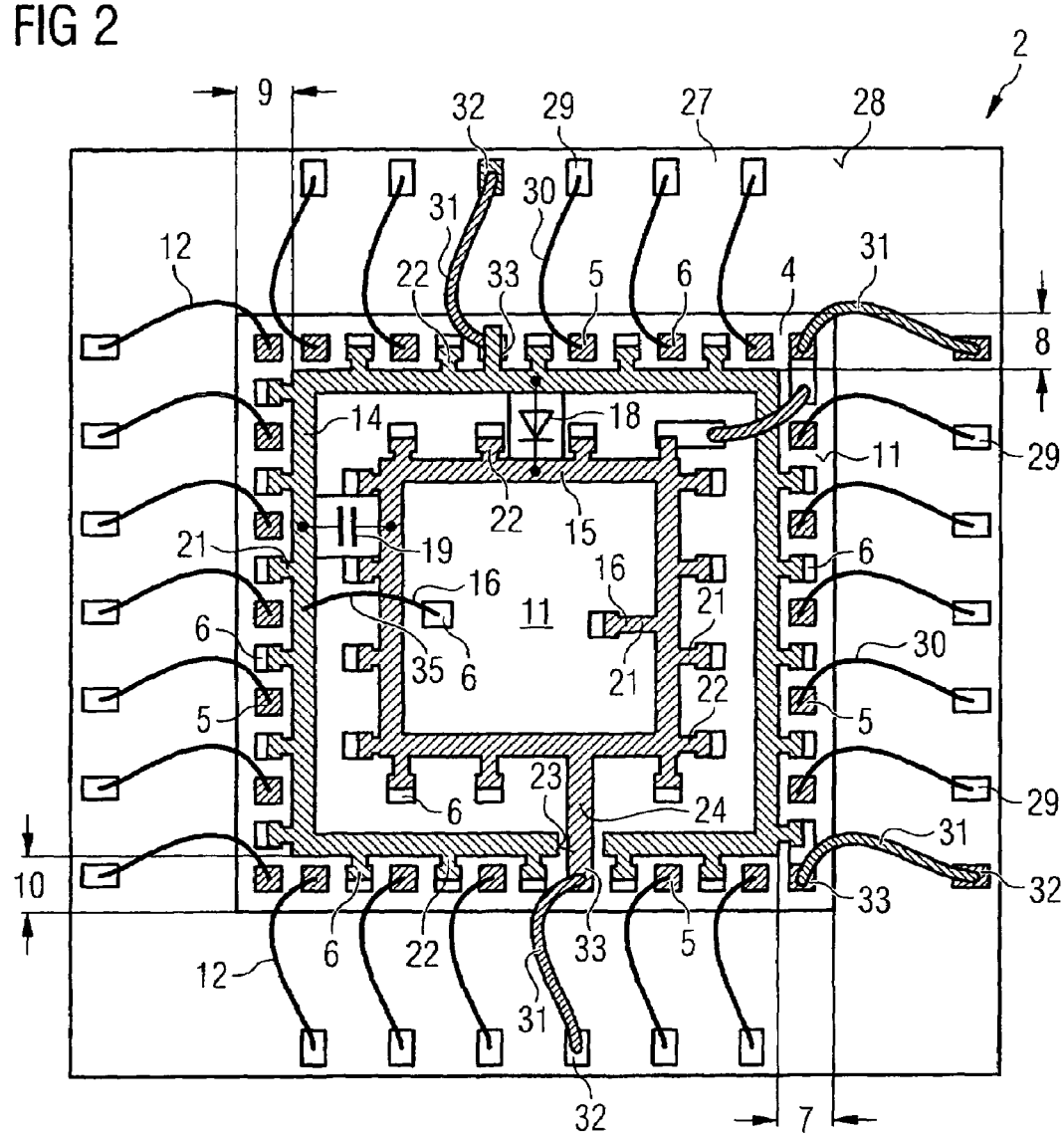
FIG. 2 schematically depicts a plan view of a semiconductor device of a second embodiment of the invention.

FIG. 2 shows a schematic plan view of a semiconductor device 2 of a second embodiment of the invention. Components having functions identical to those of FIG. 1 are identified by the same reference symbols and are thus not described again.

In this second embodiment of the invention, only the connecting elements 12 to contact pads 29 on the top side 28 of the wiring substrate 27 are produced from bonding wires 30, while the internal connections are formed with bonding lugs 22. Bonding wires 35 are used as internal connecting elements 16 only in the cases in which the supply collective electrodes 14 or 15 are to be bridged on the top side 11 of the semiconductor chip 4. Instead of bonding lugs 22, the connections between supply contact areas 6 and the supply collective electrodes 14 or 15 are also produced by conductor tracks 21.

The difference between bonding lugs 22 and conductor tracks 21 is that bonding lugs can be produced together with the patterning of metal foils for the supply collective electrodes 14 or 15, for example by selective etching or by stamping, while conductor tracks 21 can be applied in the context of the production of semiconductor wafers before the correspondingly annularly shaped supply collective electrodes 14 or 15 are applied to the conductor tracks 21 by a conductive adhesive or by a solder connection. A further difference of this second embodiment of the invention consists in the fact that supply contact areas 6 are not just arranged in the edge regions 7, 8, 9 and 10 between the signal contact areas 5, rather that further supply contact areas are arranged in the first instance between the two supply collective electrodes 14, 15 and are in part also positioned within the inner supply collective electrode 15.

A further difference with respect to the first embodiment of the invention in accordance with FIG. 1 is that, in this second embodiment of the invention, discrete, surface-mountable devices are arranged between the supply collective electrodes 14 and 15, one of the devices being a capacitor 19, which is arranged to safeguard against voltage dips between the supply collective electrodes or may also ensure short emergency supplies of the integrated circuit. Furthermore, a discrete device in the form of an overvoltage diode 18 is arranged between the two supply collective electrodes 14, 15, said diode protecting the circuit against overvoltage. This second embodiment of the invention shows that the annular supply collective electrodes 14, 15 afford a highly diversified possibility of optimally utilizing the top side 11 of the semiconductor chip 4.

FIG. 3 shows a schematic cross-section through the semiconductor device 2 of FIG. 2. This cross-section shows only a detail from an edge region of the semiconductor device 2 with a semiconductor housing 25 in which the semiconductor chip 4 with the supply collective electrodes 14 and 15 and also with the internal connecting elements 16 and the external connecting elements 12 is embedded. The internal connecting elements 16 are only arranged on the top side 11 of the semiconductor chip 4, while the external connecting element 12 leads from the top side 11 of the semiconductor chip 4 to corresponding contact pads 29 and via corresponding through contacts 34 to supply exterior contacts 26. While the internal connecting elements 16 may have thin bonding wires since only in each case one supply contact area 6 is supplied by the internal connecting elements 16, the connecting element 12 to the wiring substrate 27 is made thicker since the entire current supply of the supply collective electrodes 14 or 15 is passed via connecting element 12.

FIG. 4 shows a schematic cross-section through a semiconductor device 3 of a third embodiment of the invention. Components having functions identical to those in FIG. 1 are identified by the same reference symbols and are thus not further described.

In this third embodiment of the invention, the two supply collective electrodes 14 and 15 are arranged in a stack one above another and are electrically insulated from one another by an insulation layer 17. The areal extent of the lower supply collective electrode 14 is greater than the areal extent of the upper supply collective electrode 15, with the result that internal connecting elements 16 can be led both to the lower supply collective electrode 14 and to the upper supply collective electrode 15 without short circuits arising. Moreover, connecting elements 12 can thus be led to the wiring substrate 27, which connecting elements have thicker bonding wires 31 than the internal connecting elements 16 with their bonding wires 20. While the supply collective electrodes 14 and 15 are supplied with corresponding potentials and current via the external supply exterior connections 26, the signal contact areas 5 are electrically connected to the external signal exterior connections 13 on the underside 36 of the semiconductor device 3.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A semiconductor device comprising a semiconductor chip, the semiconductor chip comprising:
    a plurality of signal contact areas and a plurality of supply contact areas, wherein at least the signal contact areas are arranged on edge regions of an active top side of the semiconductor chip and are electrically connected by connecting elements to external signal exterior connections of the semiconductor device; and
    at least two supply collective electrodes arranged in an electrically insulated manner on the active top side of the semiconductor chip and being constructed of annularly patterned metal structures that are arranged within the signal contact areas, each of the electrodes being electrically connected by connecting elements to external supply exterior connections of the semiconductor device, wherein the supply contact areas of the semiconductor chip are electrically connected to the supply collective electrodes by internal connecting elements disposed on the active top side of the semiconductor chip;
    wherein the supply collective electrodes are arranged with one electrode stacked above another electrode on the active top side of the semiconductor chip, and the semiconductor chip further comprises at least one insulation layer arranged between two adjacently stacked electrodes.

2. The semiconductor device of claim 1, wherein at least one of the supply collective electrodes comprises a ground potential and another supply collective electrode comprises supply potentials.

3. The semiconductor device of claim 1, wherein the supply collective electrodes are arranged on the active top side of the semiconductor chip adjacent to each other such that at least one electrode lies in an annularly nested configuration with respect to another electrode.

4. The semiconductor device of claim 1, wherein at least one discrete component is arranged between the supply collective electrodes, the at least one discrete component being selected from the group consisting of voltage protection diodes, capacitors and induction components.

5. The semiconductor device of claim 1, wherein the supply contact areas of the semiconductor chip are internally electrically connected to the supply collective electrodes via bonding wire connections on the active top side of the semiconductor chip.

6. The semiconductor device of claim 1, wherein the supply contact areas of the semiconductor chip are electrically connected to the supply collective electrodes via conductor tracks on the active top side of the semiconductor chip.

7. The semiconductor device of claim 1, wherein the supply contact areas of the semiconductor chip are internally electrically connected to the supply collective electrodes via bonding lugs that are formed as part of the patterned metal structure, and the bonding lugs extend from one of the supply collective electrodes to the supply contact areas.

8. The semiconductor device of claim 1, wherein the supply contact areas are arranged on the active top side of the semiconductor chip at a location that is at least one of between the supply collective electrodes and within the supply collective electrodes.

9. The semiconductor device of claim 1, wherein at least one annularly patterned metal structure forming a supply collective electrode comprises a closed ring shaped metal structure and at least another annularly patterned metal structure forming a supply collective electrode comprises a ring shaped metal structure that is partially open.

10. A semiconductor device comprising a semiconductor chip, the semiconductor chip comprising:
   a plurality of signal contact areas and a plurality of supply contact areas, wherein at least the signal contact areas are arranged on edge regions of an active top side of the semiconductor chip and are electrically connected by connecting elements to external signal exterior connections of the semiconductor device; and
   at least two supply collective electrodes arranged in an electrically insulated manner on the active top side of the semiconductor chip and being constructed of annularly patterned metal structures that are arranged within the signal contact areas, each of the electrodes being electrically connected by connecting elements to external supply exterior connections of the semiconductor device, wherein the supply contact areas of the semiconductor chip are electrically connected to the supply collective electrodes by internal connecting elements disposed on the active top side of the semiconductor chip;
   wherein the semiconductor chip includes an outer annular supply collective electrode and an inner supply collective electrode, the outer annular supply collective electrode comprising an open ring with at least one passage opening in which is arranged a strip-type lead that connects with the inner supply collective electrode.

* * * * *